(12) United States Patent
Tomabechi et al.

(10) Patent No.: US 7,023,084 B2
(45) Date of Patent: Apr. 4, 2006

(54) PLASTIC PACKAGING WITH HIGH HEAT DISSIPATION AND METHOD FOR THE SAME

(75) Inventors: Shigehisa Tomabechi, Mine (JP); Akihiro Hamano, Ube (JP)

(73) Assignee: Sumitomo Metal (SMI) Electronics Devices Inc., Yamaguchi (JP)

( * ) Notice: Subject to any disclaimer, the term of this patent is extended or adjusted under 35 U.S.C. 154(b) by 0 days.

(21) Appl. No.: 10/746,790

(22) Filed: Dec. 23, 2003

(65) Prior Publication Data

US 2005/0073044 A1    Apr. 7, 2005

(30) Foreign Application Priority Data

Mar. 18, 2003  (JP)  .............................. 2003-073077
Apr. 14, 2003  (JP)  .............................. 2003-109491

(51) Int. Cl.
*H01L 23/34* (2006.01)
(52) U.S. Cl. .................. 257/720; 428/209; 428/322.7; 428/323; 428/418; 428/901; 257/678; 257/780; 438/106; 438/118; 438/123
(58) Field of Classification Search ............... 428/209, 428/322.7, 323, 418, 901; 438/106, 118, 438/123; 257/678, 780
See application file for complete search history.

(56) References Cited

U.S. PATENT DOCUMENTS

| 5,397,917 | A | 3/1995 | Ommen et al. |
| 5,583,378 | A | 12/1996 | Marrs et al. |
| 5,640,048 | A | 6/1997 | Selna |
| 5,854,741 | A | 12/1998 | Shim et al. |
| 6,130,477 | A | 10/2000 | Chen et al. |
| 6,254,971 | B1 * | 7/2001 | Katayose et al. ........... 428/209 |
| 6,376,908 | B1 | 4/2002 | Gaku et al. |
| 6,501,168 | B1 | 12/2002 | Castro et al. |
| 6,528,882 | B1 | 3/2003 | Ding et al. |
| 6,573,595 | B1 | 6/2003 | Chen et al. |
| 6,617,193 | B1 * | 9/2003 | Toshio et al. ............... 438/106 |

OTHER PUBLICATIONS

Patent Abstracts of Japan for JP11-297928 published on Oct. 29, 1999.
Patent Abstracts of Japan for JP2000-286357 published on Oct. 13, 2000.
Patent Abstracts of Japan for JP2001-068512 published on Mar. 16, 2001.
Communication Pursuant to Article 96(2) EPC dated Jul. 28, 2005.

* cited by examiner

*Primary Examiner*—Mai-Huong Tran
(74) *Attorney, Agent, or Firm*—Darby & Darby

(57) ABSTRACT

The present invention provides a high heat dissipation plastic package and a method for making the same that provides an inexpensive, thin high heat dissipation plastic package with good bonding precision and minimal bleeding of adhesive resin.

A Cu foil resin film is formed by bonding an adhesive resin to a Cu foil and pre-forming, at an essentially central position, a cut-out for a cavity used to mount a semiconductor element. The Cu foil resin film is bonded using the adhesive resin directly to a heat dissipation plate. A conductor wiring pattern is formed on the Cu foil resin film.

Furthermore, the heat dissipation plate includes a stopping section used to prevent resin from bleeding onto a cavity when bonding with the adhesive resin of the Cu foil resin film.

7 Claims, 6 Drawing Sheets

PLASTIC PACKAGING WITH HIGH HEAT DISSIPATION AND METHOD FOR THE SAME

BACKGROUND OF THE INVENTION

The present invention relates to a high heat dissipation plastic package for mounting semiconductor elements and a method for making the same. More specifically, the present invention relates to a high heat dissipation plastic package formed by adhesing a substrate for forming a conductor wiring pattern and a heat dissipation plate and a method for making the same.

With the increases in performance and compactness in semiconductor elements in recent years, a variety of high heat dissipation plastic packages of the BGA (BallGridArray) type and the like have been developed. These plastic packages have been developed to handle increased heat generated by semiconductor elements, increased number of terminals used for external connections, easier mounting of semiconductor elements, lower costs, lower impedances, and the like. This type of high heat dissipation plastic package is formed by using an adhesive sheet such as a prepreg sheet to bond a single- or multi-layer heat-resistant resin substrate, formed from a BT resin (a resin having bismaleimide triazine as its main component) or a polyimide resin or the like and equipped with a conductor layer formed by bonding a Cu foil on one or both sides, and a heat dissipation plate formed from a metal plate with high thermal conductivity, e.g., Cu. (For example, see U.S. Pat. No. 5,583,378 and U.S. Pat. No. 5,854,741).

A method for making a conventional high thermal dissipation plastic package 50 will be described, with references to FIG. 11(A)-(D). As shown in FIG. 11(A), a resin substrate 51, which includes a glass cloth to which a Cu foil 52 is bonded, is formed with a hole 53a for a through-hole 53 used to provide conductivity between the front and back surfaces. An electroless Cu plating film is formed on the front and back and side wall surfaces of the hole 53a, and then electricity is passed through this electroless Cu plating to perform electrolytic Cu plating, resulting in a Cu plating film 54. Next, as shown in FIG. 11(B), a dry film is adhesed to this Cu plating film 54. An etching resist pattern is formed using photolithography, where a pattern mask is applied and the pattern is exposed and developed. The Cu plating film and the Cu film 52 at the exposed holes of the etching resist pattern are etched away. The dry film is peeled off to form the wiring pattern 55. Next, as shown in FIG. 11(C), a cavity for mounting a semiconductor element is formed on the resin substrate 51, on which the wiring pattern 55 is formed. This is done by using a router to form a cut-out 56 having an essentially rectangular shape when seen from above.

As shown in FIG. 11(D), the resin substrate 51 and the heat dissipation plate 57, formed from a Cu plate or the like, are interposed by an adhesive sheet 58, e.g., a prepreg sheet, and bonded via pressure and heat to form the high heat discharge plastic package 50. A solder resist film 59 is formed on the upper surface of the resin substrate 51 to expose the necessary sections of the wiring pattern 55.

U.S. Pat. No. 6,376,908 discloses a plastic package for housing a semiconductor chip in which a semiconductor chip is secured to one side of a printed circuit board and sealed with resin. A metal plate having roughly the same size as the printed circuit board is disposed at roughly the center of the midpoint axis of the printed circuit board. Front and back circuit conductors are insulated with a thermosetting resin compound. A section of the metallic inner layer having roughly the same size as the semiconductor chip is exposed to the surface, and the semiconductor chip is secured to the surface of the exposed metal plate. More specifically, a projected metal surface for dissipating heat is exposed on the surface opposite from a projected metal surface for securing the semiconductor chip.

U.S. Pat. No. 6,501,168 discloses a high heat dissipation BGA package with a metal core and a method for making the same. The metal core includes at least one cavity and in it is mounted at least one IC chip. A dielectric layer is secured to a first surface of the metal core to surround the cavity. A chemical method is used to form a conductor layer and dielectric layer to cover the metal core.

In U.S. Pat. No. 5,397,917, an adhesive formed with a reinforcement fiber is applied to a clearance surrounding a through hole and a heat dissipation plate. The adhesive is covered with a substrate layer that includes a conductive trace.

A semiconductor element is housed in a cavity formed in a main surface of an exposed section of the heat dissipation plate and is then sealed with a cover. In this invention, there is no electrical conductivity between the heat dissipation plate and the conductive trace or the conductor pad.

In the conventional high heat dissipation plastic packages and methods for making the same described above, there are the following problems.

(1) Since the heat dissipation plate and the base for forming the conductor wiring pattern are bonded together using an adhesive or adhesive sheet applied later, the overall thickness after bonding will be thicker due to the thickness of the adhesive sheet. This is an obstacle in applications where there is a need for light, thin, compact designs, e.g., in electronic devices such as mobile telephones and personal computers.

(2) If the heat dissipation plate and the base for forming the conductor wiring pattern are bonded together using an adhesive or adhesive sheet applied later, there is an increase in time involved, number of steps, and material costs for precisely applying the adhesive to the resin substrate or the heat dissipation plate or precisely attaching the adhesive sheet. The result is increased production cost for the high heat dissipation plastic package.

(3) When bonding with an adhesive or adhesive sheet, the adhesive resin can bleed into the cavity during bonding, leading to decreased reliability when the semiconductor element is mounted in the cavity.

(4) With conventional high heat dissipation plastic packages disclosed in reference patents, the heat dissipation structure is generally complex, making it difficult to implement for BGA packages, which are relatively simple, as can be done with the present invention.

OBJECT AND SUMMARY OF THE INVENTION

The object of the present invention is to overcome these problems and to provide a high heat dissipation plastic package and a method for making the same that is inexpensive, has good bonding precision, and is thin, without requiring the use of adhesive or an adhesive sheet applied afterward between the base material for forming the conductor wiring pattern and the heat dissipation plate.

Another object of the present invention is to provide a thin high heat dissipation plastic package and method for making the same that is inexpensive, has good bonding precision, and minimal bleeding of adhesive without the use of a thick adhesive sheet, e.g., a prepreg with reinforcement fiberglass cloth, between a resin substrate and heat dissipation plate.

Since the prepreg with reinforcement fibers does not contain woven glass fibers, holes can be formed easily with lasers and the like. Also, since bleeding of the adhesive resin onto the cavity is prevented, a high heat dissipation plastic package can be provided with improved mounting reliability for the semiconductor element while allowing the layers to be laminated in a vacuum press.

Yet another object of the present invention is to provide a high heat dissipation plastic package equipped with a stable signal transmission system by making the heat dissipation plate exposed from the cavity electrically continuous with the conductor wiring pattern on the resin film by way of a metal layer formed on the inner wall of the cut-out for the cavity in the resin film after the Cu foil resin film has been adhesed to the heat dissipation plate.

In order to achieve the objects described above, the present invention provides a high heat dissipation plastic package according to the present invention wherein: a Cu foil resin film, formed by bonding an adhesive resin to a Cu foil and prepared in advance with a cut-out for a cavity used to mount a semiconductor element at an essentially central position when seen from above, is directly bonded using the adhesive resin to a heat dissipation plate for dissipating heat generated by the semiconductor element; and a conductor wiring pattern is formed on the Cu foil resin film. As a result, when bonding the heat dissipation plate and the Cu foil resin film, which serves as the base on which the conductor wiring pattern is formed, there is no need to subsequently add an adhesive sheet. Thus, the package can be thin and inexpensive, and a high heat dissipation plastic package having good bonding precision between the Cu foil resin film and the heat dissipation plate can be provided.

In order to achieve the objects described above, according to another aspect the present invention provides a high heat dissipation plastic package wherein a Cu foil resin film, formed by bonding an adhesive resin to a Cu foil and prepared in advance with a cut-out for a cavity used to mount a semiconductor element at an essentially central position when seen from above, is directly bonded using the adhesive resin to a heat dissipation plate used for dissipating heat generated by the semiconductor element and formed with a hole for a through-hole providing electrical continuity between a top surface and a bottom surface. Conductor wiring patterns are formed on the Cu foil resin film and an insulative resin formed on the bottom surface of the heat dissipation plate. As a result, when bonding the heat dissipation plate and the Cu foil resin film, which serves as the base on which the conductor wiring pattern is formed, there is no need to subsequently add an adhesive sheet. Thus, the package can be thin and inexpensive, and a high heat dissipation plastic package having good bonding precision between the Cu foil resin film and the heat dissipation plate can be provided. Also, by forming the wiring pattern on the heat dissipation plate, a high heat dissipation BGA plastic package with a cavity-up structure can be provided.

In order to achieve the objects described above, according to another aspect the present invention provides a method for making a high heat dissipation plastic package formed by bonding a Cu foil resin film and a heat dissipation plate including: a step for forming the Cu foil resin film by bonding an adhesive resin to a Cu foil and forming a cut-out in the Cu foil resin film for a cavity used to mount a semiconductor element; and a step for forming a metal member by roughening a surface of the heat dissipation plate and adhesing the metal member with the adhesive resin section of the Cu foil resin film by applying heat and pressure. As a result, the cut-out for the cavity used to mount the semiconductor element can be formed easily, and the Cu foil resin film and the heat dissipation plate can be bonded precisely and easily in one step without using an adhesive sheet. Thus, a method for making a high heat dissipation plastic package that is thin and inexpensive can be provided. Also, since the semiconductor element is mounted on the heat dissipation plate at the cavity, the heat generated by the semiconductor element can be efficiently dissipated.

In order to achieve the objects described above, according to another aspect the present invention provides a method for making a high heat dissipation plastic package formed by bonding a Cu foil resin film and a heat dissipation plate including: a step for forming the Cu foil resin film by bonding an adhesive resin to a Cu foil and forming a cut-out in the Cu foil resin film for a cavity used to mount a semiconductor element; and a step for forming a hole for a through-hole on the heat dissipation plate, forming a metal member by roughening a surface of the heat dissipation plate, directly abutting a first surface of the metal member to the adhesive resin section of the Cu foil resin film formed with the cut-out, abutting the Cu foil to a second surface of the metal member by way of a tack-dry resin, and applying pressure and heat to provide adhesion.

As a result, the cut-out for the cavity used to mount the semiconductor element can be formed easily, and the Cu foil resin film and the heat dissipation plate can be bonded precisely and easily in one step without using an adhesive sheet. Thus, a method for making a high heat dissipation plastic package that is low-profile, thin and inexpensive can be provided. Also, since the semiconductor element is mounted on the heat dissipation plate at the cavity, the heat generated by the semiconductor element can be efficiently dissipated and a conductor pattern can also be formed on the back side of the heat dissipation plate.

In order to achieve the objects described above, according to another aspect the present invention provides a method for making a high heat dissipation plastic package formed by directly bonding a Cu foil resin film and a heat dissipation plate including: a step for forming a cut-out for a cavity to mount a semiconductor element in a first Cu foil resin film, the Cu foil resin film being formed from a first and a second Cu foil resin film formed by bonding Cu film to adhesive resin; and a step for directly abutting a first surface of the metal member to the adhesive resin section of the first Cu foil resin film formed with the cut-out, directly abutting a second surface of the metal member to the adhesive resin section of the second Cu foil resin film, and applying pressure and heat to provide adhesion, the heat dissipation plate including a hole for a through-hole and a metal member on which surface roughening was performed. As a result, the cut-out for the cavity used to mount the semiconductor element can be formed easily, and the Cu foil resin film and the heat dissipation plate can be bonded precisely and easily in one step without using an adhesive sheet. Thus, a method for making a high heat dissipation plastic package that is low-profile and inexpensive can be provided. Also, since the semiconductor element is mounted on the heat dissipation plate at the cavity, the heat generated by the semiconductor element can be efficiently dissipated and a conductor pattern can also be formed on the back side of the heat dissipation plate.

In order to achieve the objects described above, according to another aspect the present invention provides a high heat dissipation plastic package wherein a Cu foil resin film, formed by bonding an adhesive resin to a Cu foil and prepared in advance with a cut-out for a cavity used to mount a semiconductor element at an essentially central position when seen from above, is directly bonded using the adhesive resin to a heat dissipation plate used for dissipating heat generated by the semiconductor element. The heat dissipation plate includes a stopping section for preventing resin bleed out to the cavity when bonding with the adhesive resin of the Cu foil resin film takes place. Since bonding the heat dissipation plate and the Cu foil resin film, which serves as the base on which the conductor wiring pattern is formed, does not require subsequently using an adhesive sheet, e.g., a prepreg containing reinforcement fibers, a thin, inexpensive package with good bonding precision between the Cu foil resin film and the heat dissipation plate can be provided.

In this case, it would be preferable in the high heat dissipation plastic package for the stopping section to be a groove formed along edges of the cut-out. As a result, the groove can prevent bleeding out of the adhesive resin to the cavity so that a high heat dissipation plastic package with improved semiconductor mounting reliability can be provided.

Alternatively, it would be preferable in the high heat dissipation plastic package for the stopping section to be a shelf that permits mounting to the cut-out with a slight clearance. As a result, the bleeding of the adhesive resin onto the cavity can be prevented with the shelf, which allows the cavity to be formed as a projection. Thus, a high heat dissipation plastic package with improved semiconductor element mounting reliability can be provided.

In order to achieve the objects described above, according to another aspect the present invention provides a method for making a high heat dissipation plastic package wherein a Cu foil resin film, formed by bonding an adhesive resin to a Cu foil and prepared in advance with a cut-out for a cavity used to mount a semiconductor element at an essentially central position when seen from above, is directly bonded using the adhesive resin to a heat dissipation plate used for dissipating heat generated by the semiconductor element. The method for making a high heat dissipation plastic package includes: a step for forming a shelf or groove on the heat dissipation plate along edges of the cut-out in the Cu foil resin film; and a step for heating the adhesive resin and bonding the Cu foil resin film with the heat dissipation plate and stopping bleeding of the adhesive resin onto the cavity with the shelf or groove. As a result, the adhesive resin of the Cu foil resin film and the heat dissipation plate can be precisely bonded in one step so that it is possible to provide a method for making a high heat dissipation plastic package that is thin and inexpensive. Also, since the adhesive resin is prevented from bleeding out to the heat dissipation plate at the cavity using a groove or shelf, the semiconductor element can be mounted with high bonding reliability, and heat generated by the semiconductor element can be efficiently dissipated.

In order to achieve the objects described above, according to another aspect the present invention provides a method for making a high heat dissipation plastic package wherein a Cu foil resin film, formed by bonding an adhesive resin to a Cu foil and prepared in advance with a cut-out for a cavity used to mount a semiconductor element at an essentially central position when seen from above, is directly bonded using the adhesive resin to a heat dissipation plate used for dissipating heat generated by the semiconductor element. The method for making a high heat dissipation plastic package includes: a step for using a holding tool including a projection that can fit into the cut-out in the Cu foil resin film to push a release film, interposed by a low-melting resin film, on the cavity and the Cu foil resin film; a step for heating the adhesive resin and bonding the Cu foil resin film with the heat dissipation plate, and using the release film, interposed by the low-melting resin film, to stop the adhesive resin from bleeding onto the cavity; and a step for removing the holding tool and removing the release film, interposed with the low-melting resin.

As a result, the adhesive resin of the Cu foil resin film and the heat dissipation plate can be precisely bonded in one step so that it is possible to provide method for making a high heat dissipation plastic package that is low-profile and inexpensive. Also, since the adhesive resin is prevented from bleeding onto the heat dissipation plate at the cavity using the release film held down with the holding tool, interposed by the low melting resin film, the semiconductor element can be mounted with high bonding reliability, and heat generated by the semiconductor element can be efficiently dissipated.

In order to achieve the objects described above, according to another aspect the present invention provides a high heat dissipation plastic package to according to the present invention wherein: a Cu foil resin film, formed by bonding an adhesive resin to a Cu foil and prepared in advance with a cut-out for a cavity used to mount a semiconductor element at an essentially central position when seen from above, is directly bonded using the adhesive resin to a heat dissipation plate for dissipating heat generated by the semiconductor element; and a conductor wiring pattern is formed on the Cu foil resin film. As a result, when bonding the heat dissipation plate and the Cu foil resin film, which serves as the base on which the conductor wiring pattern is formed, there is no need to subsequently add an adhesive sheet. Thus, the package can be thin and inexpensive, and a high heat dissipation plastic package having good bonding precision between the Cu foil resin film and the heat dissipation plate can be provided. Furthermore, a high heat dissipation plastic package equipped with a stable signal transmission system can be provided since a metal layer is formed on an inner wall of the cut-out for the cavity in order to provide electrical continuity between the heat dissipation plate and the conductor wiring pattern on the Cu foil resin film.

In order to achieve the objects described above, according to another aspect the present invention provides a high heat dissipation plastic package wherein a Cu foil resin film, formed by bonding an adhesive resin to a Cu foil and prepared in advance with a cut-out for a cavity used to mount a semiconductor element at an essentially central position when seen from above, is directly bonded using the adhesive resin to a heat dissipation plate used for dissipating heat generated by the semiconductor element and formed with a hole for a through-hole providing electrical continuity between a top surface and a bottom surface. Conductor wiring patterns are formed on the Cu foil resin film and an insulative resin formed on the bottom surface of the heat dissipation plate. As a result, when bonding the heat dissipation plate and the Cu foil resin film, which serves as the base on which the conductor wiring pattern is formed, there is no need to subsequently add an adhesive sheet. Thus, the package can be thin and inexpensive, and a high heat dissipation plastic package having good bonding precision between the Cu foil resin film and the heat dissipation plate can be provided. Also, by forming the wiring pattern on the heat dissipation plate, a high heat dissipation BGA plastic package with a cavity-up structure can be provided. Furthermore, a high heat dissipation plastic package equipped with a stable signal transmission system can be provided since a metal layer is formed on an inner wall of the cut-out for the cavity in order to provide electrical continuity between the heat dissipation plate and the conductor wiring pattern on the Cu foil resin film.

DETAILED DESCRIPTION OF THE PREFERRED EMBODIMENTS

Next, embodiments of the present invention will be described in detail, with references to the drawings, to assist in the understanding of the present invention.

Figure 2:
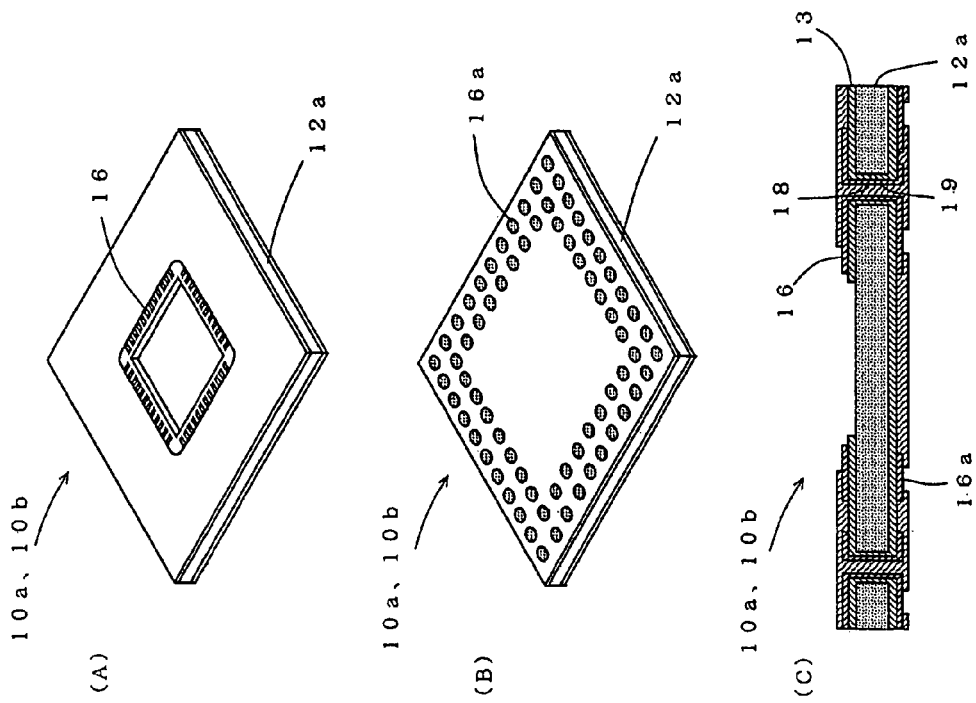
FIGS. 2(A)–2(C) show, respectively, a perspective drawing of the top side, a perspective drawing of the bottom side, and a vertical cross-section drawing of first and second embodiments of the present invention.
Figure 1:
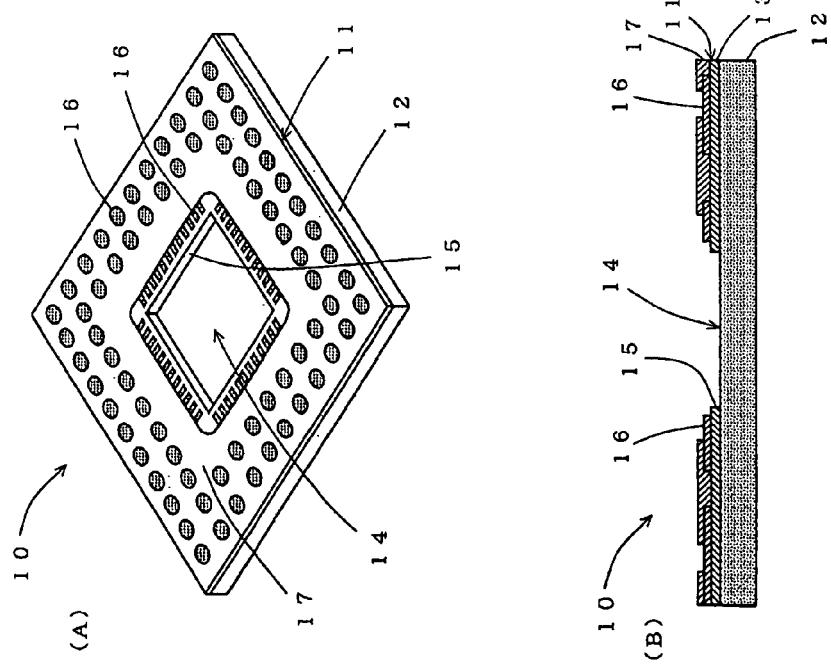
FIGS. 1(A)–1(B) show, respectively, a perspective and vertical cross-section drawing of a high heat dissipation plastic package according to an embodiment of the present invention.
Figure 6:
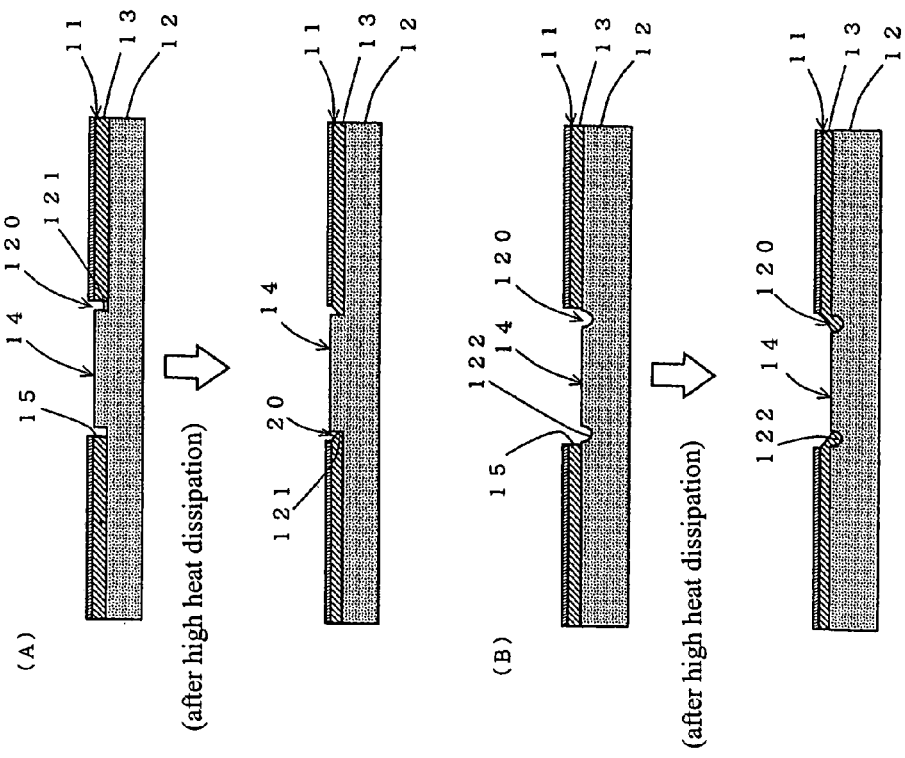
FIGS. 6(A)–6(B) are drawings illustrating stopping sections of a heat dissipation plate in a high heat dissipation plastic package and an alternative example of a high heat dissipation plastic package.

FIGS. 1(A)–1(B) show, respectively, a perspective drawing and a vertical cross-section drawing of a high heat dissipation plastic package according to an embodiment of the present invention. FIGS. 2(A)–2(C) show, respectively, an upper surface perspective drawing, a lower surface perspective drawing, and a vertical cross-section drawing of an alternative example and another alternative example of an embodiment of the present invention. FIGS. 3(A)–3(E) are drawings for the purpose of describing a method for making a high heat dissipation plastic package according to an embodiment of the present invention. FIGS. 4(A)–4(E) are drawings for the purpose of describing a method for making a high heat dissipation plastic package according to an alternative example of the present invention. FIGS. 5(A)–5(C) are drawings for the purpose of describing a method for making a high heat dissipation plastic package according to another alternative example of an embodiment of the present invention. FIGS. 6(A)–6(B) are drawings for the purpose of describing a stopping section of a heat dissipation plate of a high heat dissipation plastic package according to an embodiment of the present invention and a high heat dissipation plastic package according to an alternative example of an embodiment of the present invention. FIGS. 7(A)–7(E) are drawings for the purpose of describing a method for making a high heat dissipation plastic package according to an embodiment of the present invention. FIGS. 8(A)–8(E) are drawings for the purpose of describing a method for making a high heat dissipation plastic package according to an alternative example of an embodiment of the present invention. FIGS. 9(A)–9(D) are drawings for the purpose of describing another method for making a high heat dissipation plastic package according to an embodiment of the present invention and a high heat dissipation plastic package according to alternative example of an embodiment of the present invention. FIG. 10 is a vertical cross-section drawing of high heat dissipation plastic package according to an embodiment of the present invention.

As shown in FIGS. 1(A)–1(B), a high heat dissipation plastic package 10 according to a first embodiment of the present invention is formed with a Cu foil resin film 11 and a heat dissipation plate 12. The Cu foil resin film 11 is formed as a film by applying an adhesive resin 13 that does not include woven glass cloth material to Cu plating. A cut-out 15 for a cavity 14 for mounting a semiconductor element at essentially the center of the package when seen from above is formed on the Cu-foil resin film 11 using a punch press or the like. The heat dissipation plate 12 is formed from, for example, a Cu plate, having good thermal conductivity in order to allow heat generated by the semiconductor element to be dissipated efficiently. The surface is made rough to increase bonding strength with the adhesive resin 13. The Cu-foil resin film 11 and the heat dissipation plate 12 are bonded by abutting the thermosetting adhesive resin 13 in the Cu-foil resin film 11 against the heat-dissipating plate 12 while applying heat and pressure so that the adhesive resin 13 sets. In this high heat dissipation plastic package 10, Cu plating (not shown in the figure) is applied to the Cu foil of the Cu foil resin film 11 as well as the inner perimeters of the cavity 14 and the cut-out 15. Then, a conductor wiring pattern 16 is formed using photolithography and etching. A solder resist film 17 is then formed on the surface of the high heat dissipation plastic package 10 on the side with the conductor wiring pattern 16 so that the necessary section of the conductor wiring pattern 16 can be exposed from the opening.

The Cu foil resin film used here is formed by adhesing Cu foil with a molten epoxy-based resin film. Chopped glass filler can be included in the resin to serve as a reinforcing material. Also, the heat dissipation plate is a Cu-based metal plate, and a Cu alloy containing Zr or the like is used if strength is needed for when the plate is handled or processed.

As shown in FIGS. 2(A)–2(C), in addition to the structure described above for the high heat dissipation plastic package 10, the high heat dissipation plastic packages 10a, 10b according to an alternative example and a second alternative example of an embodiment of the present invention also include a conductor wiring pattern 16a on the lower side of the heat dissipation plate 12a to dissipate heat generated by the semiconductor element. In this case, a hole 18 for a through hole 19 used to provide electrical continuity between the top and bottom conductor wiring patterns 16, 16a is formed ahead of time by drilling or the like on the heat dissipation plate 12a. A conductor is formed on the wall surface of the hole 18 so that there is no short circuit, thus providing electrical continuity between the top and bottom conductor wiring patterns 16, 16a.

In this high heat dissipation plastic package 10a, the semiconductor element is mounted on the top side, with the external connection terminals, e.g., solder balls, connected on the bottom side, thus forming a cavity-up type package. This allows the heat generated by the semiconductor element to be efficiently dissipated, and both sides of the package are used effectively while the package dimensions can be kept extremely small. In the high heat dissipation plastic package 10a according to the first alternative example of the embodiment of the present invention, the conductor wiring pattern 16a on the bottom side is formed based on having the Cu foil bonded to the conductor wiring pattern 16 via half-dry (B-stage) resin. Also, in the high heat dissipation plastic package 10b according to the second alternative example of the embodiment of the present invention, the conductor wiring pattern 16a is formed based on the Cu foil resin film 11. The half-dry resin used here is, for example, an epoxy resin, or a BT resin, and these resins can include fillers, e.g., silica, glass, in different forms besides cloth form.

Next, a method for making the high heat dissipation plastic package 10 according to the embodiment of the present invention will be described referring to FIGS. 3(A)–3(E).

Figure 3:
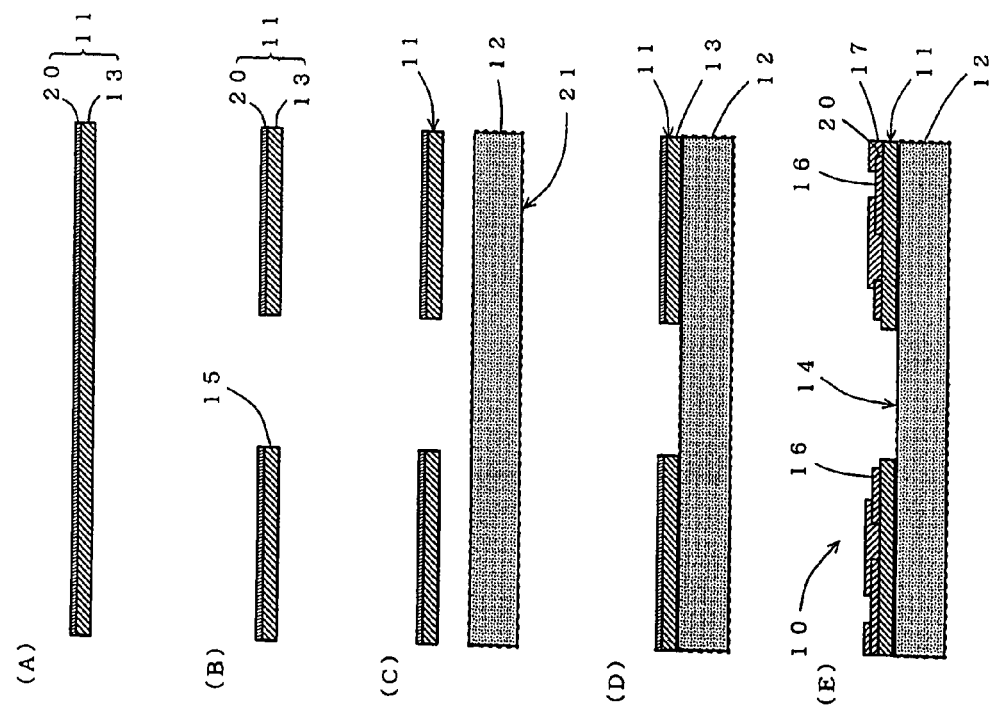
FIGS. 3(A)–3(E) are drawings illustrating a method for making a high heat dissipation plastic package according to an embodiment of the present invention.

As shown in FIG. 3(A), the Cu foil resin film 11, which is bonded to the heat dissipation plate 12 to make the high heat dissipation plastic package 10 (see FIG. 3(E)), is formed by using the doctor blade method or roll coater method to apply a thermosetting B-stage adhesive resin (tack-dry resin) 13 that does not contain woven glass cloth material with a thickness of approximately 50–100 microns on a Cu foil 20 having a thickness of 10–20 microns. By using a Cu foil that has been heat treated ahead of time in a reducing atmosphere, a stable peel-back strength once the adhesive resin 13 is bonded can be provided.

Next, as shown in FIG. 3(B), a punch press or the like is used to form a cut-out 15 for the cavity 14 (see FIG. 3(E)) used to mount the semiconductor element in the Cu foil resin film 11. Since the Cu foil resin film 11 is formed by bonding the Cu foil 20 and the bonding adhesive 13, with the resin being thin and not containing woven glass cloth or the like, the cut-out 15 can be formed in an efficient, precise, and inexpensive manner using a punching press rather than a router or the like.

Next, as shown in FIG. 3(C). the heat dissipation plate 12, which is a metal member with high thermal conductivity such as Cu or Cu alloy, is given a surface treatment 21 to make the surface rougher through honing, black oxide treatment, etc. This surface treatment 21 can improve bonding strength when bonding takes place with the adhesive resin 13.

Next, as shown in FIG. 3(D), a vacuum press or the like is used to apply heat and pressure to the Cu foil resin film 11 and the heat dissipation plate 12, with the adhesive resin 13 of the Cu foil resin film 11 being directly abutted against the heat dissipation plate 12. If a vacuum press is used to apply heat and pressure, the following setting conditions, for example, can be used to set the adhesive resin 13 and provide bonding: a vacuum of 50 mmHg or less, a temperature of 170°–190° C., a pressure of 2–3 MPa, with a temperature of at least 175° C. being maintained for at least 40 minutes.

Next, as shown in FIG. 3(E), Cu plating formed from electroless Cu plating and electrolytic Cu plating (not shown in the figures) is applied on the Cu foil 20 of the Cu foil resin film 11 at the inner perimeter sections of the cavity 14 and the cut-out 15. Then, the conductor wiring pattern 16 is formed using a standard semi-additive or subtractive method or the like. The high heat dissipation plastic package 10 is completed by forming the solder resist film 17 on the surface on which the conductive wiring pattern 16 is formed so that the necessary sections of the conductive wiring pattern 16 can be exposed.

Next, a method for making a high heat dissipation plastic package 10a according to an alternative example of the embodiment of the present invention will be described using FIGS. 4(A)–4(E).

Figure 4:
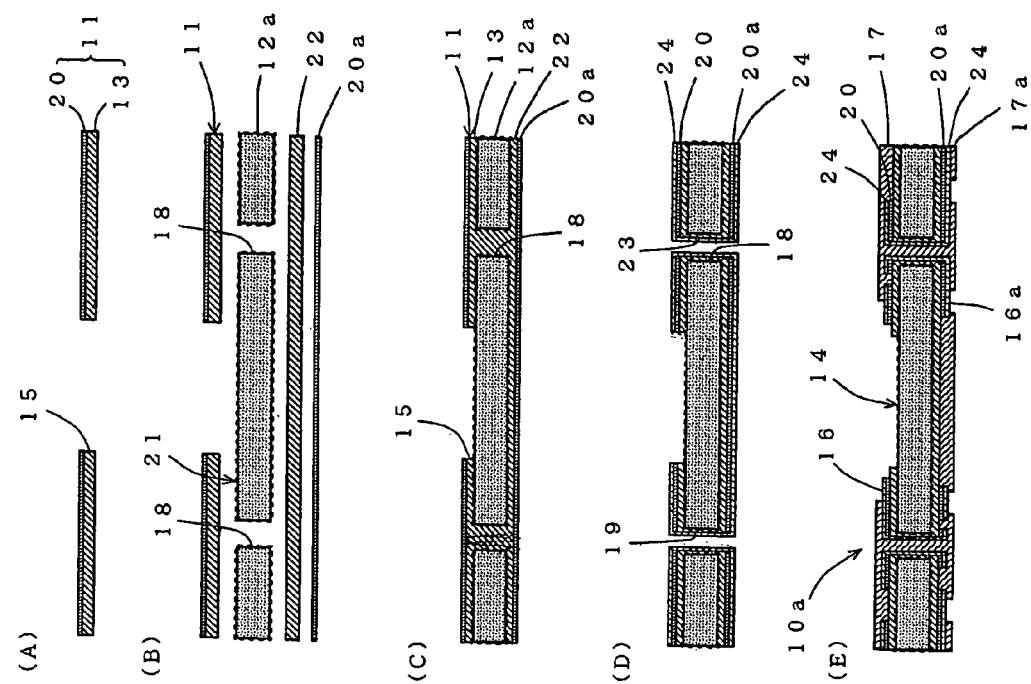
FIGS. 4(A)–4(E) are drawings illustrating an alternative example of a method for making a high heat dissipation plastic package according to an embodiment of the present invention.
Figure 5:
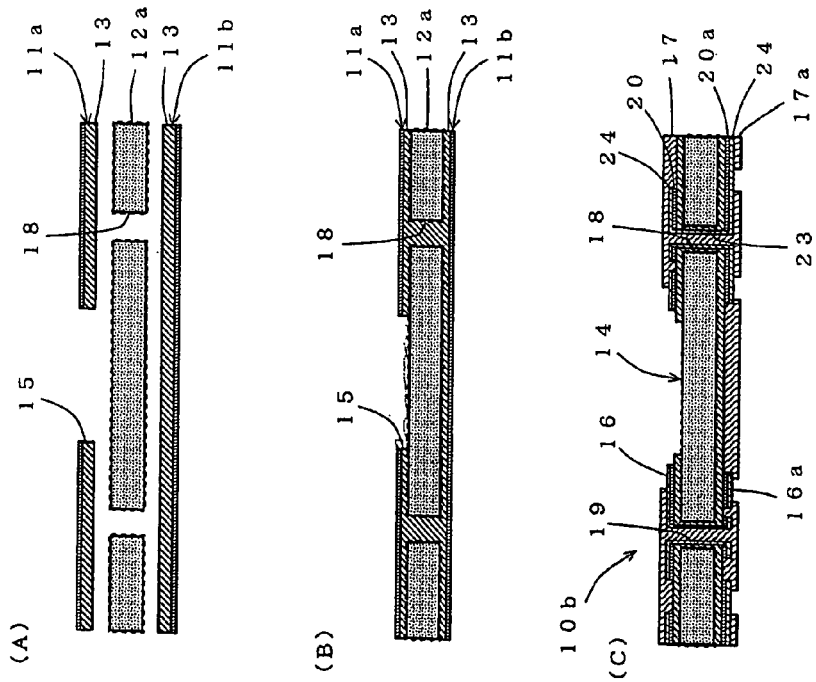
FIGS. 5(A)–5(C) are drawings illustrating a second alternative example of a high heat dissipation plastic package according to an embodiment of the present invention.

As shown in FIG. 4(A), the Cu foil resin film 11 used to make the high heat dissipation plastic package 10a is formed as in the high heat dissipation plastic package 10 by applying the adhesive resin 13 as a film on the Cu foil 20 and then forming the cut-out 15 with a punch press.

Next, as shown in FIG. 4(B), holes 18 for through-holes 19 are formed using a dril machine or the like on the heat dissipation plate 12a, formed as a metal member with a high thermal conductivity such as Cu or Cu alloy. The through-holes 19 are used to provide electrical continuity between the upper and lower conductor wiring patterns 16, 16a (see FIG. 4(E)) of the package. Surface treatment 21, e.g., through honing or black oxide treatment, is performed on the heat dissipation plate 12a to provide a rough surface. Then, a tack-dry resin 22 and a Cu foil 20a used to form the lower conductor wiring pattern 16a are prepared on the bottom side of the heat dissipation plate 12a.

Next, as shown in FIG. 4(C), the adhesive resin 13 of the Cu foil resin film 11 formed with the cut-out 15 is abutted directly to the upper surface of the thermal dissipation plate 12a, while a Cu film 20a is abutted against the surface on the lower side of the thermal dissipation plate 12a, interposed by a tack-dry resin 22. As in the high thermal dissipation plastic package 10, a vacuum press or the like is used to apply pressure and heat so that the entire structure is bonded and adhesed together. This adhesing causes the adhesive resin 13 and the tack-dry resin 22 to fill the holes 18 of the thermal dissipation plate 12a.

Next, as shown in FIG. 4(D), holes 23 for through-holes 19, which have diameters smaller than those of the holes 18, are formed with a drill machine or the like so that the wall surfaces of the holes 18, which are filled with the adhesive resin 13 and the tack-dry resin 22, are covered with resin. Then, electroless Cu plating and electrolytic Cu plating are performed. As a result, electrical continuity is provided between the upper Cu foil 20 and a Cu plating film 24 and the lower Cu foil 20a and a Cu plating film 24 by way of the through hole 19, formed by the Cu plating film 24 applied to the wall surfaces of the hole 23. Electrical continuity is also provided between the cavity 14 and the inner wall of the cut-out 15.

Next, referring to FIG. 4(E), conductor wiring patterns 16, 16a are formed on the upper Cu foil 20 and the Cu plating film 24 and the lower Cu film 20a and the Cu plating film 24 using a standard semi-additive method, subtractive method, or the like, as in the high heat dissipation plastic package 10. Furthermore, solder resist films 17, 17a are formed on the surfaces with the conductor wiring patterns 16, 16a in order to expose necessary sections of the conductor wiring patterns 16, 16a through openings. Thermal tubes (not shown in the figure) are formed at the bottom of the cavity 14 in which the semiconductor element is mounted. The thermal tubes are connected to the heat dissipation plate 12a and are exposed through an opening of the solder resist film 17a. These vias provide further improvements in dissipation of heat generated by the semiconductor element.

Next, a method for making a high heat dissipation plastic package 10b according to another alternative example of the embodiment of the present invention will be described referring to FIGS. 5(A)–5(C).

As shown in FIG. 5(A), the first Cu foil resin film 11a and the heat dissipation plate 12a, which is formed as a metal member with a high thermal conductivity such as Cu or Cu alloy, are used to make the high heat dissipation plastic package 10b and are produced in the same manner as the Cu foil resin film 11 and the heat dissipation plate 12a of the high heat dissipation plastic package 10a. On the bottom side of the heat dissipation plate 12a are prepared the first Cu foil resin film 11a and the second Cu foil resin film 11b for forming the bottom conductor wiring pattern 16a.

Next, as shown in FIG. 5(B), the adhesive resin 13 of the first Cu foil resin film 11a in which the cut-out 15 is formed is abutted directly against the upper surface of the heat dissipation plate 12a, and the adhesive resin 13 of the second Cu foil resin film 11b is abutted directly against the lower surface of the heat dissipation plate 12a, and a vacuum press or the like is used to apply heat and pressure as in the high heat dissipation plastic package 10a, thus adhesing the entire structure all at once. As a result of this adhesing, the holes 18 of the heat dissipation plate 12a are filled with the adhesive resin 13 abutted against the upper and lower surfaces.

Next, as shown in FIG. 5(C), a drill machine or the like is used as in the high heat dissipation plastic package 10a to perforate a hole 23 of a through-hole 19 having a diameter smaller than that of the hole 18, resulting in the hole 18 filled with the adhesive resin 13 having a resin covering on its wall surfaces. Then, electroless Cu plating and electrolytic Cu plating are performed so that the Cu foil 20 and the Cu plating film 24 on the top surface are electrically continuous with the Cu foil 20a and the Cu plating film 24 on the bottom surface by way of the through hole 19 formed by the Cu plating film 24 on the wall surface of the hole 23. Also, there is electrical continuity with the inner perimeter of the cut-out 15 and the cavity 14.

Furthermore, conductor wiring patterns 16, 16a are formed on the Cu foil 20 and the Cu plated film 24 on the top and the Cu foil 20a and the Cu plated film 24 on the bottom. On the surfaces with the conductor wiring patterns 16, 16a are formed solder resist films 17, 17a, which expose the necessary parts of the conductor wiring patterns 16, 16a through openings. This results in the high heat dissipation plastic package 10b. As in the high heat dissipation plastic package 10a, a thermal via passage (not shown in the figure) can be formed at the bottom of the cavity 14 in which the semiconductor element is mounted so that the dissipation of heat generated by the semiconductor element can be improved.

In order to improve understanding of the present invention, another embodiment of the present invention will be described, with reference to the attached drawings.

As shown in FIGS. 1(A) and 2(B), the high heat dissipation plastic package 10 consists of the Cu foil resin film 11 and the heat dissipation plate 12. With regard to the Cu foil resin film 11, the adhesive resin 13, which does not contain woven glass cloth material, is applied as a film to the Cu foil. A punch press or the like is used on the Cu foil resin film 11 to form the cut-out 15 for the cavity 14 used to mount the semiconductor element at essentially the center of the package when seen from above. The heat dissipation plate 12 is prepared in advance from a Cu plate or the like having good thermal conduction properties so that heat generated by the semiconductor element can be efficiently dissipated. The surface of the heat dissipation plate 12 is roughened in order to improve the bonding strength with the adhesive resin 13. This heat dissipation plate 12 is also formed with a stopping section to prevent resin from bleeding into the cavity 14 when bonding takes place with the adhesive resin 13, which is bonded to the Cu foil resin film 11. The Cu foil resin film 11 and the heat dissipation plate 12 are bonded by abutting the thermosetting adhesive resin 13 of the Cu foil resin film 11 against the heat dissipation plate 12 and applying heat and pressure to set the adhesive resin 13.

Cu plating is applied to the high heat dissipation plastic package 10 on the Cu foil of the Cu foil resin film 11 and the inner perimeter of the cut-out 15 and the cavity 14. Photolithography and etching are performed to form the conductor wiring patterns 16. Then, the solder resist film 17 is formed on the side of the high heat dissipation plastic package 10 with the conductor wiring pattern 16 with the necessary sections exposed from openings.

A high heat dissipation plastic package 10 according to another embodiment of the present invention and a stopping section 120 of the heat dissipation plates 12, 12a of the high heat dissipation plastic package 10a according to an alternative example of the present invention will be described, with references to FIGS. 6(A)–6(B). In FIGS. 6(A)–6(B), the high heat dissipation plastic package 10 is presented as an example. As shown in FIG. 6(A), it would be preferable for the heat dissipation plate 12 used in the high heat dissipation plastic package 10 to include a stopping section 120 formed from a shelf 121 disposed so that the Cu foil resin film 11 can be mounted with a slight clearance at the edges of the cut-out 15 of the Cu foil resin film 11. This shelf 121 allows the cavity 14, used for mounting the semiconductor element in the heat dissipation plate 12, to be formed projecting higher than the sections to which the Cu foil resin film 11 are bonded. The bleeding of resin into the cavity 14 is reduced because the stopping section 120 formed from the shelf 121 blocks bleeding of the adhesive resin 13 when the Cu foil resin film 11 is bonded with the heat dissipation plate 12 with heat and pressure.

Also, as shown in FIG. 6(B), it would be preferable in the heat dissipation plate 12 of the high heat dissipation plastic package 10 for the Cu foil resin film 11 to include a stopping section 120 formed from a groove 122 disposed along the edges of the cut-out 15 of the Cu foil resin film 11. This groove 122 serves as a partitioning section between the cavity 14 of the heat dissipation plate 12, where the semiconductor element is mounted, and the section where the Cu foil resin film 11 is bonded. The bleeding of resin into the cavity 13 is reduced since the adhesive resin 13 that bleeds out when the Cu foil resin film 11 and the heat dissipation plate 12 are bonded with heat and pressure can fall into the groove 122 of the stopping section 120. The stopping section 120 disposed on the heat dissipation plate 12 can be formed so that it includes the groove 122 and so that the cavity 14 is projected higher than the sections where the Cu foil resin film 11 is bonded.

Next, a method for making the high heat dissipation plastic package according to an embodiment of the present invention will be described, with references to FIGS. 7(A)–7(E).

Figure 7:
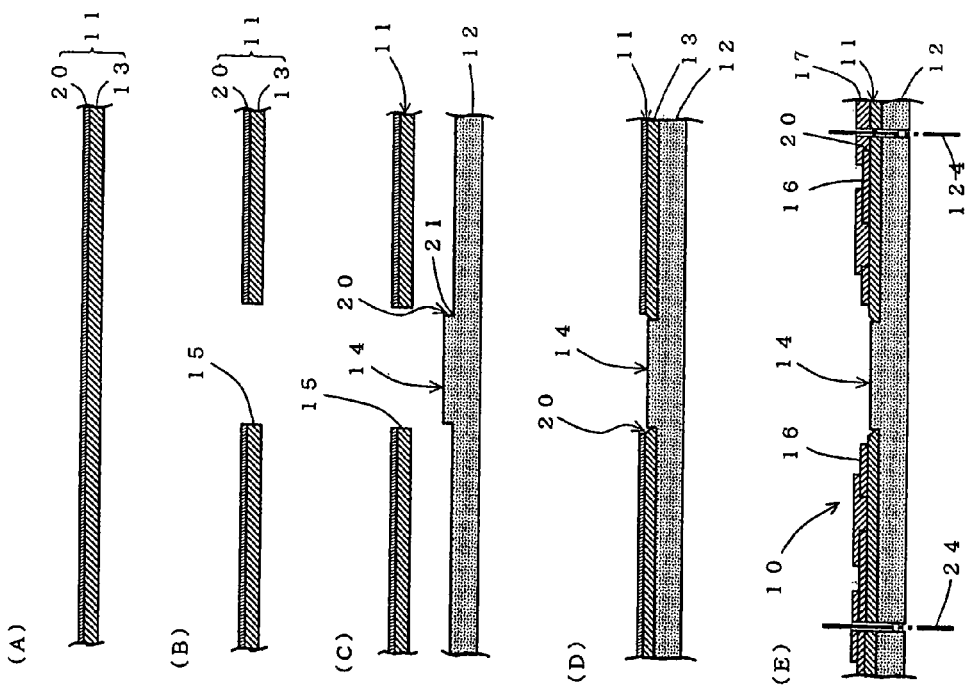
FIGS. 7(A)–7(E) are drawings illustrating a method for making a high heat dissipation plastic package.
Figure 11:
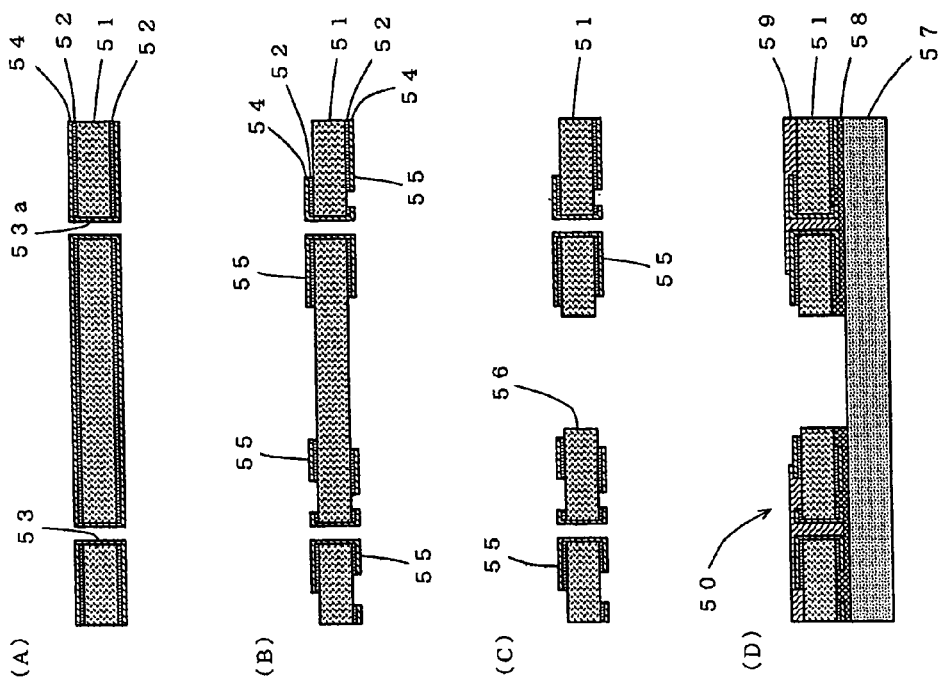
FIGS. 11(A)–11(D) are drawings illustrating a conventional method for making a high heat dissipation plastic package.

As shown in FIG. 7(A), the Cu foil resin film 11 bonded to the heat dissipation plate 12 to make the high heat dissipation plastic package 10 is formed as a film by using the doctor blade method, the roll coater method, or the like to apply onto a Cu foil 20 having a thickness of 10–20 microns a thermosetting B-stage adhesive resin (tack-dry resin) 13 that does not contain woven glass cloth material. If the Cu foil is heat treated in a reducing atmosphere ahead of time, a stable peeling strength with high bonding strength can be provided after bonding with the adhesive resin 13.

Next, as shown in FIG. 7(B), a punch press or the like is used to prepare the cut-out 15 in the Cu foil resin film 11 for the cavity 14 (see FIG. 7(E)) used to allow mounting of the semiconductor element. The cut-out 15 can be prepared in the Cu foil resin film 11 efficiently, precisely, and inexpensively with a punch press without requiring a router or the like since the Cu foil resin film 11 is formed by bonding the Cu foil 20 and the adhesive resin 13, the resin does not contain woven glass cloth or the like, and the bonded structure itself is thin.

Next, as shown in FIG. 7(C), the heat dissipation plate 12, which is formed from a metal member with a high thermal conductivity, e.g., Cu or a Cu alloy, and a thickness of 0.2 mm. The heat dissipation plate 12 is formed with an example of a stopping section 120, where the section to form the cavity 14 is formed as a projection by etching, cutting, or the like. As a result, the stopping section 120 for preventing bleeding of the adhesive resin 13 is formed as a shelf 121 extending along the perimeter of the projected cavity 14 so that there is a slight clearance between the edge of the cut-out 15 formed on the Cu foil resin film 11. The stopping section 120 can alternatively be formed as a groove 122 (see FIG. 7(B)) through etching, cutting, or the like (not shown in the figure). Also, the surface of the heat dissipation plate 12 can be made rougher by processing it with black oxide treatment, honing, etc., thus improving the bonding strength when it is bonded with the adhesive resin 13.

Next, as shown in FIG. 7(D), the adhesive resin 13 of the Cu foil resin film 11 and the heat dissipation plate 12 are directly abutted, and a vacuum press or the like is used to apply heat and pressure to bond the Cu foil resin film 11 and the heat dissipation plate 12. If a vacuum press is used to apply heat and pressure, the adhesive resin 13 is set for bonding with a vacuum of no more than 50 mmHg, a temperature of 170°–190° C., and pressure of 2–3 MPa, with a temperature of at least 175° C. being applied for at least 40 minutes. When this bonding with heat and pressure takes place, there is resin bleed with the adhesive resin 13, but the stopping section 120 stops this resin bleed, reducing resin bleed onto the cavity 14.

Next, as shown in FIG. 7(E), Cu plating (not shown in the figure) is applied through electroless Cu plating and electrolytic Cu plating on the inner perimeter sections of the cut-out 15 and the cavity 14, followed by the formation of the conductor wiring pattern 16 using, for example, a standard semi-additive or subtractive method. Then, the solder resist film 17 is formed on the surface with the conductor wiring pattern 16 to expose the necessary sections of the conductor wiring pattern 16 through openings. Since multiple high heat dissipation plastic packages 10 are formed in sheets, they are ultimately cut apart at cutting sections 124 after semiconductor elements and the like have been mounted. To make separation easier, the metal sections at the outer perimeters of the product units (not shown in the figure) can be removed or soft etching can be performed.

Next, a high heat dissipation plastic package 10a according to an alternative example of an embodiment of the present invention will be described, with references to FIGS. 8(A)–8(E).

Figure 8:
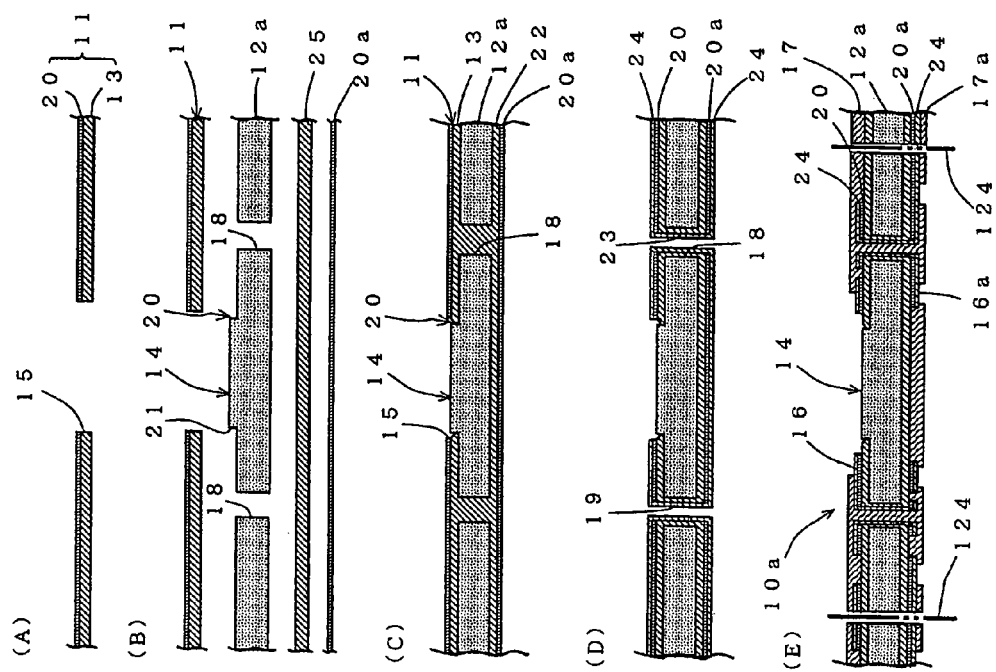
FIGS. 8(A)–8(E) are drawings illustrating an alternative example of a method for making a high heat dissipation plastic package.

As shown in FIG. 8(A), the Cu foil resin film 11 used to make the high heat dissipation plastic package 10a is formed, as in the high heat dissipation plastic package 10, by applying a film of adhesive resin 13 on the Cu foil 20 and forming the cut-out 15 with a punch press.

Next, as shown in FIG. 8(B), the stopping section 120 for preventing resin bleed of the adhesive resin 13 is formed from the shelf 121 and is disposed at the edges of the cavity 14 so that the cavity forms a projection as in the high heat dissipation plastic package 10. Also, while not shown in the figure, the stopping section 120 can alternatively be formed as the groove 122 (see FIG. 6(B)) as in the high heat dissipation plastic package 10. Then, holes 18 for throughholes 19 are formed on the heat dissipation plate 12a to provide electrical continuity between the conductor wiring patterns 16, 16a (see FIG. 8(E)) at the top and bottom sides of the package. The surface of the heat dissipation plate 12a is treated with black oxide, honing, or the like in order to provide roughness. Tack-dry resin 22 and Cu foil 20a are prepared on the bottom surface of the heat dissipation plate 12a to form the bottom-side conductor wiring pattern 16a.

Next, as shown in FIG. 8(C), the adhesive resin 13 of the Cu film resin film 11 with the cut-out 15 is directly abutted to the top surface of the heat dissipation plate 12a. The Cu foil 20a is abutted to the bottom surface of the heat dissipation plate 12a via the partly-cared resin 22. As in the high heat dissipation plastic package 10, a vacuum press or the like is used to apply heat and pressure so that the entire structure is bonded together. As a result of this bonding, the holes 18 of the heat dissipation plate 12a are filled with tack-dry resin 22 and adhesive resin 13. With the application of heat and pressure, there is resin bleed of the adhesive resin 13, but the stopping section 120 prevents this resin from bleeding so that resin bleed onto the cavity 14 is reduced.

Next, as shown in FIG. 8(D), a drill machine or the like is used toperforate holes 23 for through-holes 19, which have diameters of the holes 18, resulting in the walls of the holes 18 filled with the adhesive resin 13 and the tack-dry resin 22 being covered with resin. Then, electroless Cu plating and electrolytic Cu plating are applied to form the Cu plating film 24 on the walls of the holes 23. As a result, the top Cu foil 20 and the Cu plating film 24 are made electrically continuous with the bottom Cu film 20a and the Cu plating film 27 as well as the cavity 14 and the inner walls of the cut-out 15.

Next, as shown in FIG. 8(E), conductor wiring patterns 16, 16a are formed on the upper Cu foil 20 and the Cu plating film 27 and the lower Cu foil 20a and the Cu plating film 24 using a semi-additive method, a subtractive method, or the like, as in the high heat dissipation plastic package 10. Then, solder resist films 17, 17a are formed on the surfaces having the conductor wiring patterns 16, 16a so that the necessary sections of the conductor wiring patterns 16, 16a are exposed from openings. This results in the high heat dissipation plastic package 10a.

As in the high heat dissipation plastic package 10, the high heat dissipation plastic package 10a is arranged in sheets of multiple units, so cutting sections 124 are cut after the semiconductor elements or the like are mounted to make the final product. Also, thermal vias (not shown in the figure) connected to the heat dissipation plate 12a and exposed from an opening of the solder resist film 17a can be formed on the bottom of the cavity 14 on which the semiconductor element, resulting in more efficient dissipation of heat generated by the semiconductor element.

Also, on the bottom side of the heat dissipation plate 12a below the cavity 14, in which the semiconductor element is mounted, it would be possible to form a tube (not shown in the figure) shaped like the stopping section 120 with the shelf 121 formed on the top surface of the heat dissipation plate 12a. Thermal vias (not shown in the figure) similar to the one described above can also be provided. As a result, heat generated by the semiconductor element can be more efficiently dissipated. Also, by forming equivalent projections on both sides of the heat dissipation plate 12a, warping of the heat dissipation plate 12a can be prevented. Also, the high heat dissipation plastic package 10a described above is made by using the tack-dry resin 22 and the Cu foil 20a to form the conductor wiring pattern 16a on the bottom side of the heat dissipation plate 12a, but it would also be possible to use a Cu foil resin film 11 similar to the Cu foil resin film 11 used to form the conductor wiring pattern 16 on the top surface.

Next, an alternate method for making the high heat dissipation plastic package 10 according to an embodiment of the present invention and the high heat dissipation plastic package 10a according to an alternative example will be described, with references to FIGS. 9(A)–9(D).

In FIGS. 9(A)–9(D), the alternate method is presented using the high heat dissipation plastic package 10.

Figure 9:
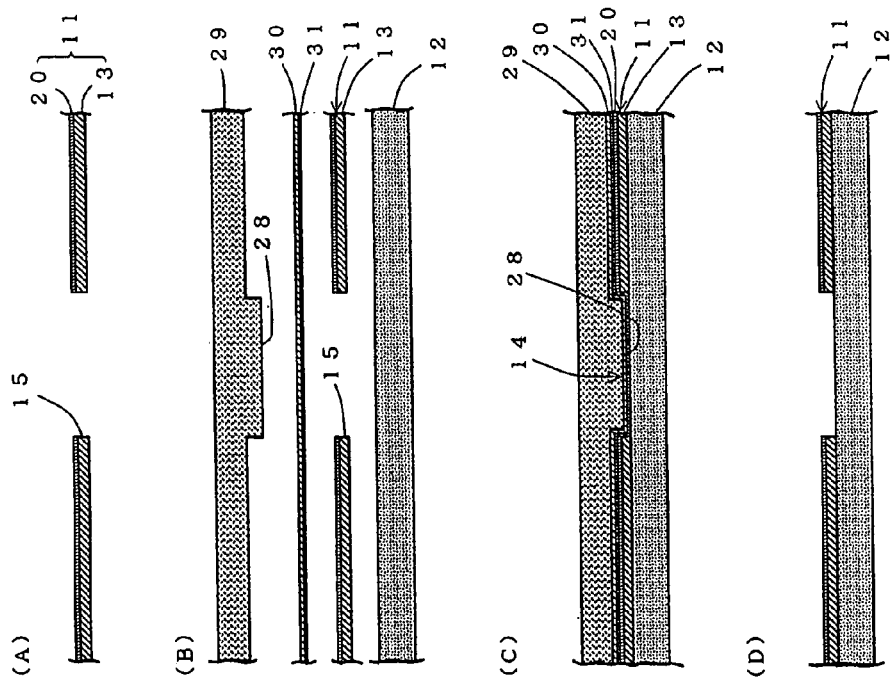
FIGS. 9(A)–9(D) are drawings illustrating another method for making a high heat dissipation plastic package and an alternative example of a high heat dissipation plastic package.
Figure 10:
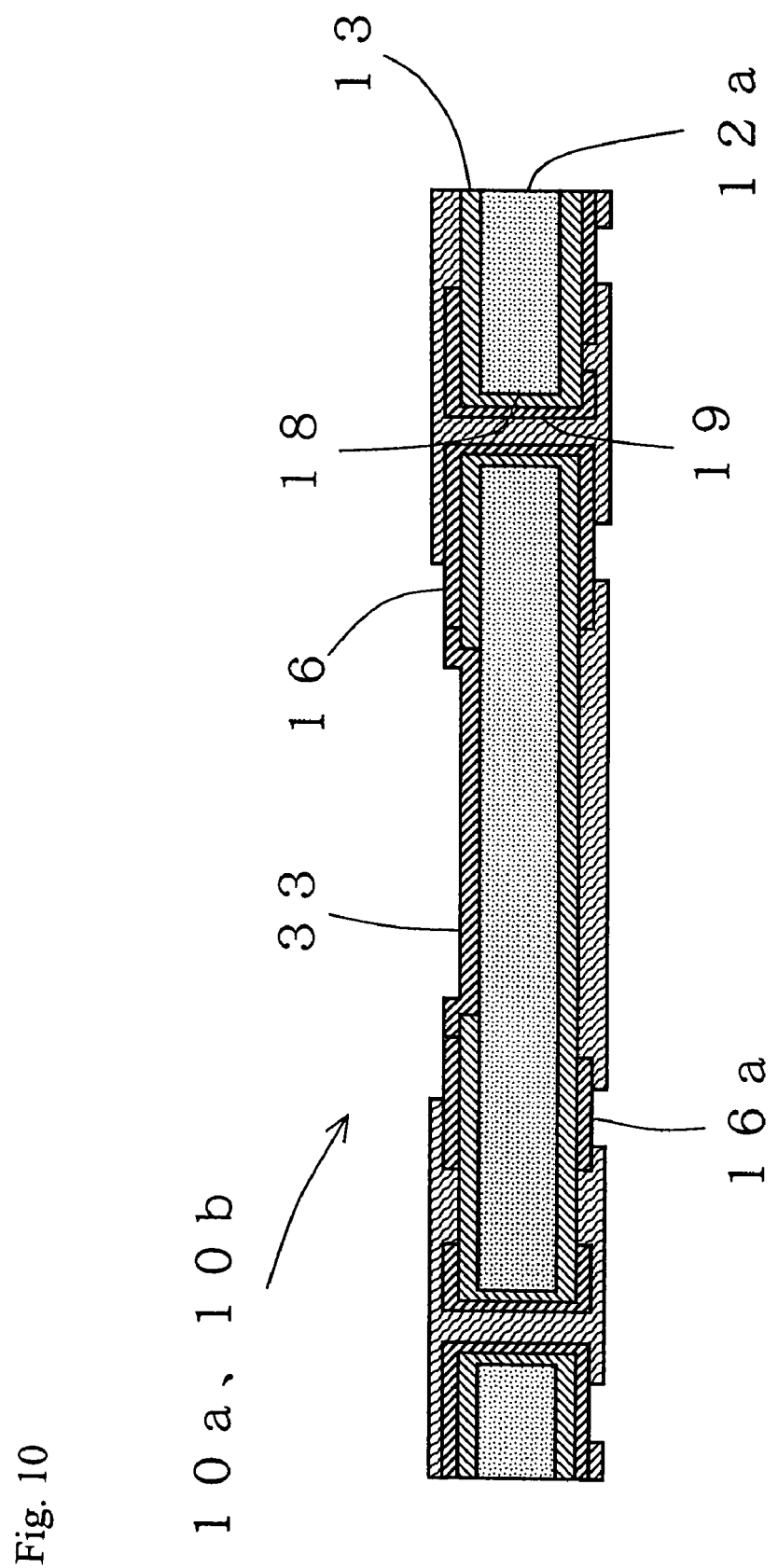
FIG. 10 is a vertical cross-section drawing of a high heat dissipation plastic package according to an embodiment of the present invention.

As shown in FIG. 9(A), the Cu foil resin film 11 used in the high heat dissipation plastic package 10 is formed in the same manner as in all of the above packages by applying a film of the adhesive resin 13 to the Cu foil 20. The cut-out 15 is formed in the Cu foil resin film 11 using a punch press.

Next, as shown in FIG. 9(B), the heat dissipation plate 12 is formed from a metal member with a high thermal conductivity, e.g., Cu or Cu alloy, so that heat generated by the semiconductor element can be dissipated. The surface of the heat dissipation plate 12 is processed with black oxide treatment, honing, etc., to provide a rough surface that improves bonding strength when bonded with the adhesive resin 13. Also, a holding tool 29 formed from resin or metal is prepared with a projection 28 that can fit against the cut-out 15 formed in the Cu foil resin film 11. Also, a low-melting resin film 30 and release film 31 are prepared to interpose between the holding tool 29 and the Cu foil resin film 11.

For the low-melting resin film, a resin film such as PE (polyethylene) that melts at a temperature of no more than 130° C., more preferably no more than 100° C.

Next, as shown in FIG. 9(C), the Cu foil resin film 11 is mounted on the heat dissipation plate 12 so that the side of the Cu foil resin film 11 with the adhesive resin 13 comes into contact with the heat dissipation plate 12, and the release film 31 is mounted in the cavity 14 and the Cu foil resin film 11 with the low-melting resin film 30 interposed. The holding tool 29 is used to push the low-melting resin film 30 from above. The projection 28 of the holding tool 29 fits against the cut-out 15 of the Cu foil resin film 11, so this projection 28 allows the cavity 14 to be sealed with the release film 31 with the low-melting resin film 30 interposed. The adhesive resin 13 is then heated in this state to bond the Cu foil resin film 11 and the heat dissipation plate 12, and the release film 31 interposed by the low-melting resin film 30 stops the adhesive resin 13 from bleeding onto the cavity 14. An example of a preferable release film is a film based on a PET (polyethylene terephthalate) resin with a silicone or fluorine-based release agent applied to both sides of the film.

Next, as shown in FIG. 9(D), after the Cu foil resin film 11 and the heat dissipation plate 12 have been bonded, the holding tool 29 is removed and the release film 31 and the low-melting resin film 30 are removed.

The subsequent procedures for making the package are the same as those described above and result in the high heat dissipation plastic package 10 or the high heat dissipation plastic package 10a according to the alternative example.

As shown in FIG. 10, a metal layer is formed on the inner walls of the cut-out in the resin film for the cavity after the Cu foil resin film has been attached to the heat dissipation plate. The metal layer provides electrical continuity between the conductor wiring pattern on the resin film and the heat dissipation plate exposed at the cavity. This electrical continuity can be provided, e.g., by performing metal plating when the conductor pattern is formed on the resin film. In this manner, the heat dissipation plate serves as a ground layer, making it possible to provide a high heat dissipation plastic package equipped with a signal transmission system that is more stable relative to voltage changes and the like.

In the high heat dissipation plastic package, a Cu foil resin film, formed by bonding an adhesive resin to a Cu foil and prepared in advance with a cut-out for a cavity used to mount a semiconductor element at an essentially central position when seen from above, is directly bonded using the adhesive resin to a heat dissipation plate for dissipating heat generated by the semiconductor element. A conductor wiring pattern is formed on the Cu foil resin film. As a result, when bonding the heat dissipation plate and the Cu foil resin film, which serves as the base on which the conductor wiring pattern is formed, there is no need to subsequently add an adhesive agent or an adhesive sheet containing reinforcement woven fiberglass cloth. Thus, the package can be thin and inexpensive, and a high heat dissipation plastic package having good bonding precision between the Cu foil resin film and the heat dissipation plate can be provided.

In the high heat dissipation plastic package, a Cu foil resin film, formed by bonding an adhesive resin to a Cu foil and prepared in advance with a cut-out for a cavity used to mount a semiconductor element at an essentially central position when seen from above, is directly bonded using the adhesive resin to a heat dissipation plate used for dissipating heat generated by the semiconductor element and formed with a hole for a through-hole providing electrical continuity between a top surface and a bottom surface. Conductor wiring patterns are formed on the Cu foil resin film and an insulative resin formed on the bottom surface of the heat dissipation plate. As a result, when bonding the heat dissipation plate and the Cu foil resin film, which serves as the base on which the conductor wiring pattern is formed, there is no need to subsequently add an adhesive agent or an adhesive sheet containing woven reinforcement fiberglass cloth. Thus, the package can be thin and inexpensive, and a high heat dissipation plastic package having good bonding precision between the Cu foil resin film and the heat dissipation plate can be provided. Also, by forming the wiring pattern on the heat dissipation plate, a high heat dissipation BGA plastic package with a high cavity can be provided.

The method for making a high heat dissipation plastic package formed by bonding a Cu foil resin film and a heat dissipation plate includes: a step for forming the Cu foil resin film by bonding an adhesive resin to a Cu foil and forming a cut-out in the Cu foil resin film for a cavity used to mount a semiconductor element; and a step for forming a metal member by roughening a surface of the heat dissipation plate and adhesing the metal member with the adhesive resin section of the Cu foil resin film by applying heat and pressure. As a result, the cut-out for the cavity used to mount the semiconductor element can be formed easily and the Cu foil resin film and the heat dissipation plate can be bonded precisely and easily in one step without using an adhesive sheet containing woven reinforcement fiberglass cloth.

Thus, a method for making a high heat dissipation plastic package that is thin and inexpensive can be provided. Also, since the semiconductor element is mounted on the heat dissipation plate at the cavity, the heat generated by the semiconductor element can be efficiently dissipated.

The method for making a high heat dissipation plastic package formed by bonding a Cu foil resin film and a heat dissipation plate includes: a step for forming the Cu foil resin film by bonding an adhesive resin to a Cu foil and forming a cut-out in the Cu foil resin film for a cavity used to mount a semiconductor element; and a step for forming a hole for a through-hole on the heat dissipation plate, forming a metal member by roughening a surface of the heat dissipation plate, directly abutting a first surface of the metal member to the adhesive resin section of the Cu foil resin film formed with the cut-out, abutting the Cu foil to a second surface of the metal member by way of a tack-dry resin, and applying pressure and heat to provide adhesion. As a result, the cut-out for the cavity used to mount the semiconductor element can be formed easily and the Cu foil resin film and the heat dissipation plate can be bonded precisely and easily in one step without using an adhesive agent containing woven reinforcement fiberglass cloth. Thus, a method for making a high heat dissipation plastic package that is thin and inexpensive can be provided. Since the semiconductor element is mounted on the heat dissipation plate at the cavity, the heat generated by the semiconductor element can be efficiently dissipated and a conductor pattern can also be formed on the back side of the heat dissipation plate.

The method for making a high heat dissipation plastic package formed by bonding a Cu foil resin film and a heat dissipation plate includes: a step for forming a cut-out for a cavity to mount a semiconductor element in a first Cu foil resin film, the Cu foil resin film being formed from a first and a second Cu foil resin film formed by bonding Cu film to adhesive resin; and a step for directly abutting a first surface of the metal member to the adhesive resin section of the first Cu foil resin film formed with the cut-out, directly abutting a second surface of the metal member to the adhesive resin section of the second Cu foil resin film, and applying pressure and heat to provide adhesion, the heat dissipation plate including a hole for a through-hole and a metal member on which surface roughening was performed. As a result, the cut-out can be formed easily, and the Cu foil resin film and the heat dissipation plate can be bonded precisely and easily in one step without using an adhesive sheet containing woven reinforcement fiberglass cloth. Thus, a method for making a high heat dissipation plastic package that is thin and inexpensive can be provided. Also, since the semiconductor element is mounted on the heat dissipation plate at the cavity, the heat generated by the semiconductor element can be efficiently dissipated and a conductor pattern can also be formed on the back side of the heat dissipation plate.

The high heat dissipation plastic package, wherein a Cu foil resin film, formed by bonding an adhesive resin to a Cu foil and prepared with a cut-out for a cavity used to mount a semiconductor element at an essentially central position when seen from above, is directly bonded using the adhesive resin to a heat dissipation plate used for dissipating heat generated by the semiconductor element. The heat dissipation plate includes a stopping section for preventing resin bleed onto the cavity when bonding with the adhesive resin of the Cu foil resin film takes place. Since bonding the heat dissipation plate and the Cu foil resin film, which serves as the base on which the conductor wiring pattern is formed, does not require subsequently using an adhesive sheet, e.g., a prepreg sheet containing woven reinforcement fiberglass, a thin, inexpensive package with good bonding precision between the Cu foil resin film and the heat dissipation plate can be provided. Also, during bonding, bleeding of the adhesive resin onto the cavity is prevented, and the reliability of mounting the semiconductor element can be improved.

Also, in the high heat dissipation plastic package, the stopping section is a groove formed along edges of the cut-out. As a result, the groove can prevent bleeding of the adhesive resin onto the cavity so that a high heat dissipation plastic package with improved semiconductor mounting reliability can be provided.

Furthermore, in the high heat dissipation plastic package, the stopping section is a shelf that permits mounting to the cut-out with a slight clearance. As a result, the bleeding of the adhesive resin onto the cavity can be prevented with the shelf, which allows the cavity to be formed as a projection. Thus, a high heat dissipation plastic package with improved semiconductor element mounting reliability can be provided.

The method for making the high heat dissipation plastic package wherein a Cu foil resin film, formed by bonding an adhesive resin to a Cu foil and prepared in advance with a cut-out for a cavity used to mount a semiconductor element at an essentially central position when seen from above, is directly bonded using the adhesive resin to a heat dissipation plate used for dissipating heat generated by the semiconductor element. The method for making a high heat dissipation plastic package includes: a step for forming a shelf or groove on the heat dissipation plate along edges of the cut-out in the Cu foil resin film; and a step for heating the adhesive resin and bonding the Cu foil resin film with the heat dissipation plate and stopping bleeding of the adhesive resin onto the cavity with the shelf or groove. As a result, the adhesive resin of the Cu foil resin film and the heat dissipation plate can be precisely bonded in one step so that it is possible to provide method for making a high heat dissipation plastic package that is thin and inexpensive. Also, since the adhesive resin is prevented from bleeding onto the heat dissipation plate at the cavity using a groove or shelf, the semiconductor element can be mounted with high bonding reliability, and heat generated by the semiconductor element can be efficiently dissipated.

The method for making the high heat dissipation plastic package wherein a Cu foil resin film, formed by bonding an adhesive resin to a Cu foil and prepared in advance with a cut-out for a cavity used to mount a semiconductor element at an essentially central position when seen from above, is directly bonded using the adhesive resin to a heat dissipation plate used for dissipating heat generated by the semiconductor element. The method for making a high heat dissipation plastic package includes: a step for using a holding tool including a projection that can fit into the cut-out in the Cu foil resin film to push a release film, interposed by a low-melting resin film, on the cavity and the Cu foil resin film; a step for heating the adhesive resin and bonding the Cu foil resin film with the heat dissipation plate, and using the release film, interposed by the low-melting resin film, to stop the adhesive resin from bleeding onto the cavity; and a step for removing the holding tool and removing the release film, interposed with the low-melting resin. As a result, the adhesive resin of the Cu foil resin film and the heat dissipation plate can be precisely bonded in one step so that it is possible to provide method for making a high heat dissipation plastic package that is low-profile and inexpensive. Also, since the adhesive resin is prevented from bleeding onto the heat dissipation plate at the cavity using the release film held down with the holding tool, interposed by the low melting resin film, the semiconductor element can be mounted with high bonding reliability, and heat generated by the semiconductor element can be efficiently dissipated.

The high heat dissipation plastic package provides wherein: a Cu foil resin film, formed by bonding an adhesive resin to a Cu foil and prepared in advance with a cut-out for a cavity used to mount a semiconductor element at an essentially central position when seen from above, is directly bonded using the adhesive resin to a heat dissipation plate for dissipating heat generated by the semiconductor element; and a conductor wiring pattern is formed on the Cu foil resin film.

As a result, when bonding the heat dissipation plate and the Cu foil resin film, which serves as the base on which the conductor wiring pattern is formed, there is no need to subsequently add an adhesive sheet containing woven fiberglass reinforcement cloth. Thus, the package can be thin and inexpensive, and a high heat dissipation plastic package having good bonding precision between the Cu foil resin film and the heat dissipation plate can be provided. Furthermore, a high heat dissipation plastic package equipped with a stable signal transmission system can be provided since a metal layer is formed on an inner wall of the cut-out for the cavity in order to provide electrical continuity between the heat dissipation plate and the conductor wiring pattern on the Cu foil resin film.

The high heat dissipation plastic package wherein a Cu foil resin film, formed by bonding an adhesive resin to a Cu foil and prepared in advance with a cut-out for a cavity used to mount a semiconductor element at an essentially central position when seen from above, is directly bonded using the adhesive resin to a heat dissipation plate used for dissipating heat generated by the semiconductor element and formed with a hole for a through-hole providing electrical continuity between a top surface and a bottom surface. Conductor wiring patterns are formed on the Cu foil resin film and an insulative resin formed on the bottom surface of the heat dissipation plate. As a result, when bonding the heat dissipation plate and the Cu foil resin film, which serves as the base on which the conductor wiring pattern is formed, there is no need to subsequently add an adhesive sheet containing woven reinforcement fiberglass cloth. Thus, the package can be thin and inexpensive, and a high heat dissipation plastic package having good bonding precision between the Cu foil resin film and the heat dissipation plate can be provided. Also, by forming the wiring pattern on the heat dissipation plate, a high heat dissipation BGA plastic package with a cavity-up structure can be provided. Furthermore, a high heat dissipation plastic package equipped with a stable signal transmission system can be provided since a metal layer is formed on an inner wall of the cut-out for the cavity in order to provide electrical continuity between the heat dissipation plate and the conductor wiring pattern on the Cu foil resin film.

What is claimed is:

1. A high heat dissipation plastic package comprising:
   a Cu foil resin film, containing an adhesive resin and a Cu foil, is bonded to a heat dissipation plate, and includes a cut-out for a cavity at an essentially central position, when seen from above, in which is mounted a semiconductor element;
   the heat dissipation plate that dissipates heat generated by said semiconductor element, and comprises:
      respective Cu foil resin films bonded to opposing surfaces of the heat dissipation plate;
      at least one through-hole extending through the heat dissipation plate, wherein the through-hole includes a continuous Cu plating extending longitudinally along an inner diameter and the through-hole being resin-filled extending longitudinally along an outer diameter; and
   conductor wiring pattern formed on at least one of said Cu foil resin film.

2. The high heat dissipation plastic package as described in claim 1, wherein a metal layer is formed on an inner wall of said cut-out for said cavity in order to provide electrical continuity between said heat dissipation plate and said conductor wiring pattern on said Cu foil resin film.

3. A high heat dissipation plastic package comprising:
   a Cu foil resin film, containing an adhesive resin and a Cu foil, is bonded to a heat dissipation plate, and includes a cut-out for a cavity at an essentially central position, when seen from above, in which is mounted a semiconductor element;
   the heat dissipation plate that dissipates heat generated by said semiconductor element, and comprises:
      respective Cu foil resin films bonded to top and bottom surfaces of the heat dissipation plate; and
      a hole for a through-hole that provides electrical continuity between the top surface and the bottom surface of the heat dissipation plate;
      wherein said through-hole is lined along an outer circumference with adhesive resin that insulates the heat dissipation plate from a Cu plating disposed along an inner diameter of the through-hole;
   conductor wiring patterns are formed on said Cu foil resin film; and
   an insulative resin is disposed on said bottom surface of said heat dissipation plate.

4. The high heat dissipation plastic package as described in claim 3 wherein a metal layer is formed on an inner wall of said cut-out for said cavity in order to provide electrical continuity between said heat dissipation plate and said conductor wiring pattern on said Cu foil resin film.

5. A high heat dissipation plastic package comprising:
   a Cu foil resin film, containing an adhesive resin and a Cu foil, is bonded to a heat dissipation plate, and includes a cut-out for a cavity at an essentially central position, when seen from above, in which is mounted a semiconductor element;
   the heat dissipation plate that dissipates heat generated by said semiconductor element;
   a high heat dissipation plastic package including a stopping section that prevents resin from bleeding out to said cavity when bonding with said adhesive resin of said Cu foil resin film takes place.

6. The high heat dissipation plastic package as described in claim 5 wherein said stopping section is a groove formed along edges of said cut-out.

7. The high heat dissipation plastic package as described in claim 5, wherein said stopping section is a shelf that permits mounting to said cut-out with a slight clearance.

* * * * *